(12) United States Patent
Gurney et al.

(10) Patent No.: US 8,035,932 B2
(45) Date of Patent: Oct. 11, 2011

(54) LORENTZ MAGNETORESISTIVE SENSOR WITH INTEGRATED SIGNAL AMPLIFICATION

(75) Inventors: Bruce Alvin Gurney, San Jose, CA (US); Ernesto E. Marinero, Saratoga, CA (US); Andrew Stuart Troup, Cambridge (GB); David Arfon Williams, Cambridge (GB); Joerg Wunderlich, Cambridge (GB)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1019 days.

(21) Appl. No.: 11/858,816

(22) Filed: Sep. 20, 2007

(65) Prior Publication Data
US 2009/0080118 A1    Mar. 26, 2009

(51) Int. Cl.
G11B 5/60    (2006.01)
(52) U.S. Cl. .................................................... 360/324.2
(58) Field of Classification Search .................. None
See application file for complete search history.

(56) References Cited

U.S. PATENT DOCUMENTS

| | | | |
|---|---|---|---|
| 3,800,193 A | 3/1974 | Ashar et al. | 317/235 |
| 3,987,485 A * | 10/1976 | Sugaya et al. | 360/63 |
| 4,607,271 A | 8/1986 | Popovic et al. | 357/27 |
| 5,502,325 A | 3/1996 | Sokolich et al. | 257/421 |
| 6,122,127 A * | 9/2000 | Flinsbaugh | 360/66 |
| 6,195,228 B1 | 2/2001 | Bennett et al. | 360/112 |
| 6,590,389 B1 | 7/2003 | Shibasaki et al. | 324/252 |
| 6,707,122 B1 | 3/2004 | Hines et al. | 257/421 |
| 2004/0207035 A1 | 10/2004 | Witcraft et al. | 257/427 |
| 2006/0018054 A1 | 1/2006 | Chattopadhyay et al. | 360/313 |

FOREIGN PATENT DOCUMENTS

| | | |
|---|---|---|
| CH | 686645 | 5/1996 |
| JP | 57052160 | 3/1982 |
| JP | 59055064 | 3/1984 |
| JP | 2002289943 | 10/2002 |
| JP | 2004279325 | 10/2004 |

OTHER PUBLICATIONS

Moller et al., "Low-oise magnetic-flux sensors based on the extraordinary magnetoresistance effect" Applied Physics Letters, vol. 84, No. 17, Apr. 26, 2004.
Hoener et al., "Geometry-enhanced magnetoresistance of narrow Au/InAs hybrid structures incorporating a two-dimensional electron system" Journal of Applied Physics 99, 2006.

* cited by examiner

*Primary Examiner* — Mark Blouin
(74) *Attorney, Agent, or Firm* — Zilka-Kotab, PC

(57) ABSTRACT

A Lorentz magnetoresistive sensor having integrated signal amplification. The sensor is constructed upon a substrate such as a semiconductor material, and an amplification circuit such as transistor is constructed directly into the substrate on which the magnetoresistive device is constructed. This integrated signal amplification greatly enhances sensor performance by eliminating a great deal of signal noise that would otherwise be added to the read signal.

11 Claims, 8 Drawing Sheets

LORENTZ MAGNETORESISTIVE SENSOR WITH INTEGRATED SIGNAL AMPLIFICATION

RELATED APPLICATIONS

The present application is related to commonly assigned U.S. patent application Ser. No. 11/549,879, entitled "EMR Sensor and Transistor Formed on the Same Substrate", filed on Oct. 16, 2006, which is incorporated herein by reference for all purposes as if fully set forth herein.

FIELD OF THE INVENTION

The present invention relates generally to extraordinary magnetoresistive (EMR) sensors and more particularly to an EMR sensor design with built in signal amplification.

BACKGROUND OF THE INVENTION

The heart of a computer's long term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, or spacer layer, sandwiched between first and second ferromagnetic layers, referred to as a pinned layer and a free layer. First and second leads are connected to the spin valve sensor for conducting a sense current therethrough. The magnetization of the pinned layer is oriented generally perpendicular to the air bearing surface (ABS) and the magnetic moment of the free layer is oriented generally parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

However, a significant problem presented by such GMR sensors is that of excessive magnetic noise or signal noise, which limits ability of GMR sensors to achieve ever increasing data rates and areal densities needed for current and future data recording applications. Magnetic noise arises from the thermal fluctuations of the free layer at the sensor ambient temperature, as the magnetic order competes with the thermally-induced magnetic disorder. As the sensor gets smaller, this magnetic noise increases. It is already a significant part of the signal noise budget in GMR sensors and will play an ever increasing role as devices are made smaller.

An important class of potential magnetoresistive sensors, magnetic recording sensors and scanning sensors, called Lorentz Magnetoresistors, rely on the Lorentz force resulting from the motion of a charged carrier in a magnetic field. One type of such devices is called a Hall sensor. Another is what has been called an Extraordinary Magnetoresistive Sensor (EMR). An advantage of these sensors is that the active region of the sensor is constructed of non-magnetic semiconductor materials, and does not suffer from the problem of magnetic noise that exists in giant magnetoresistive sensors (GMR) and tunnel valves, both of which use magnetic films in their active regions.

The EMR sensor includes a pair of voltage leads and a pair of current leads in contact with one side of the active region and an electrically conductive shunt in contact with the other side of the active region. In the absence of an applied magnetic field, sense current through the current leads passes into the semiconductor active region and is shunted through the shunt structure. When an applied magnetic field is present, current is deflected from the shunt and passes primarily through the semiconductor active region, thereby increasing the electrical resistance of the device. This change in electrical resistance in response the applied magnetic field is detected across the voltage leads. EMR is described by T. Zhou et al., "Extraordinary magnetoresistance in externally shunted van der Pauw plates", Appl. Phys. Lett., Vol. 78, No. 5, 29 Jan. 2001., pp. 667-669.

As disclosed in U.S. Patent Application US20060018054A1, entitled NARROW TRACK EMR DEVICE, such EMR devices provide a pathway for producing narrow track sensors with unprecedented spatial resolution requiring no shields. However, the signal amplitude in response to nanoscale magnetic domains is expected to be small, rendering signal detection and processing with high Signal to Noise Ratio (SNR) challenging, thereby precluding the use of EMR sensors for recording densities beyond 1 Tb/in$^2$.

Therefore there is a strong felt need for a mechanism for efficiently amplifying a signal from an Lorentz magnetoresistive device without introducing undue amounts of noise into the signal to be detected. Such a design, method or structure would allow such magnetoresistive structures to be used in future high data density recording devices.

SUMMARY OF THE INVENTION

The present invention provides an integrated signal amplification circuit built into a substrate on which a magnetoresistive sensor is constructed. The magnetoresistive sensor can be, for example an Extraordinary Magnetoresistive sensor (EMR).

The substrate on which the sensor is formed can be constructed of a semiconductor material, and a transistor amplifier can be formed in the semiconductor substrate.

The integrated signal amplification greatly enhances performance by reducing signal noise that would otherwise be introduced into the signal by remote amplification.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
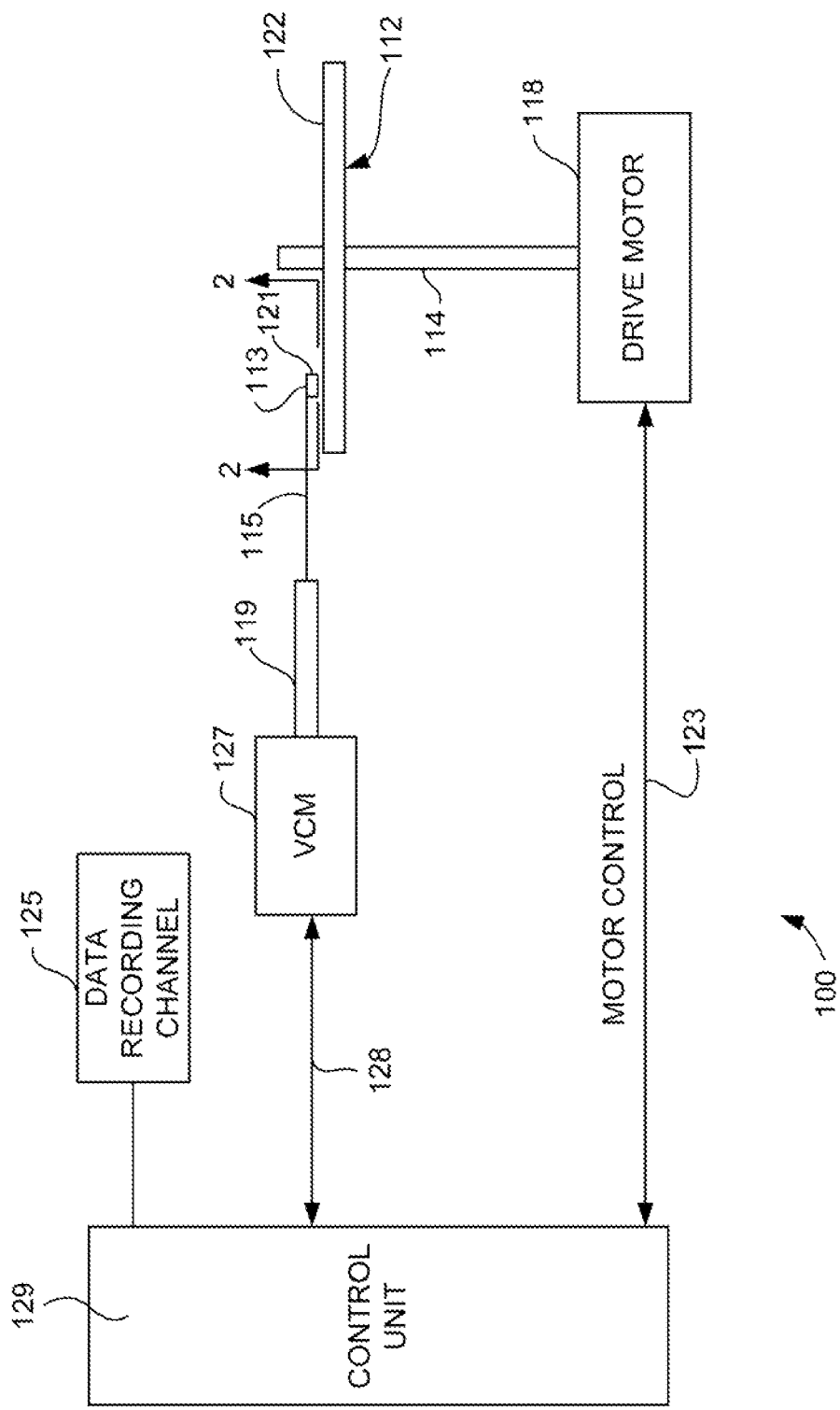
FIG. 1 is a schematic illustration of a disk drive system in which the invention might be embodied.

Referring now to FIG. 1, there is shown a disk drive 100 which could embody this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
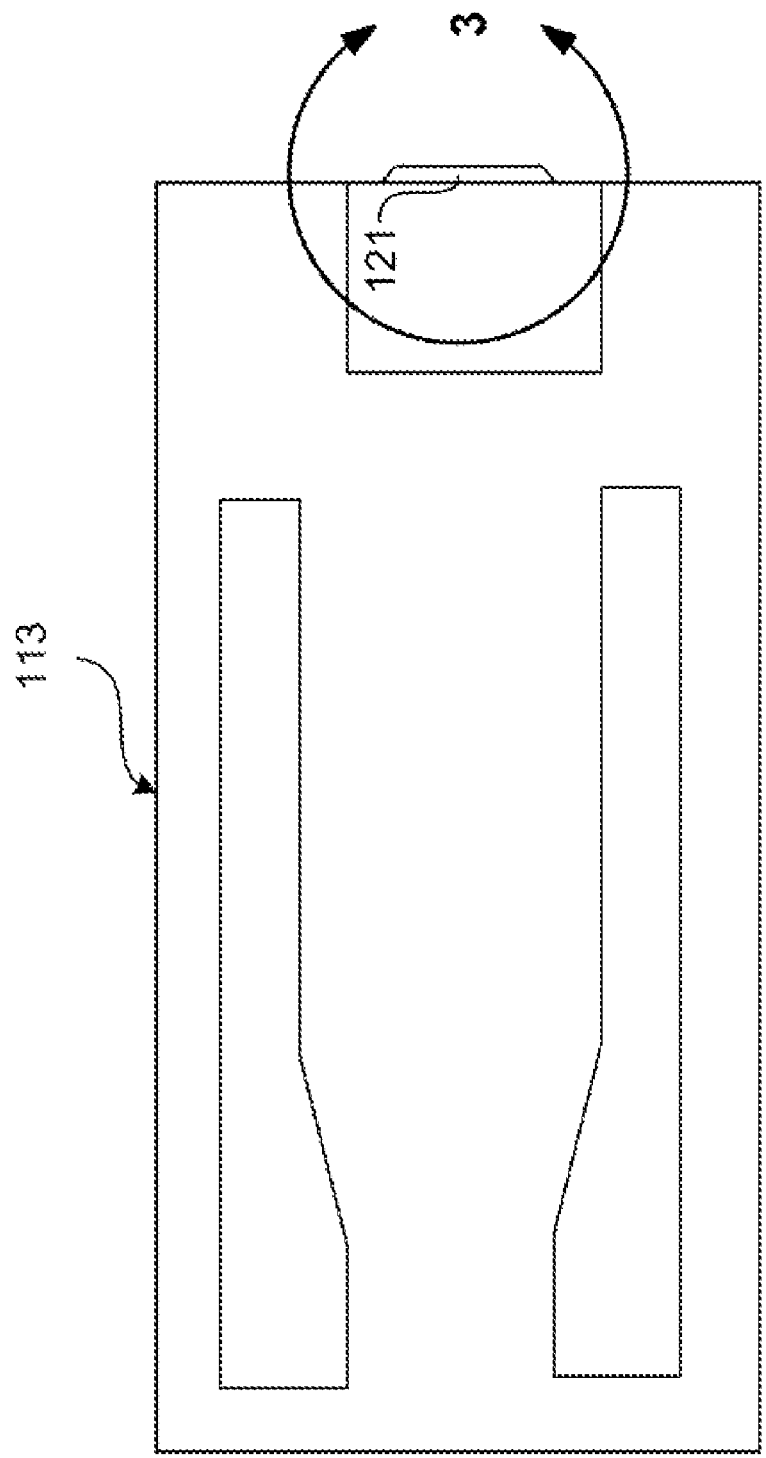
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
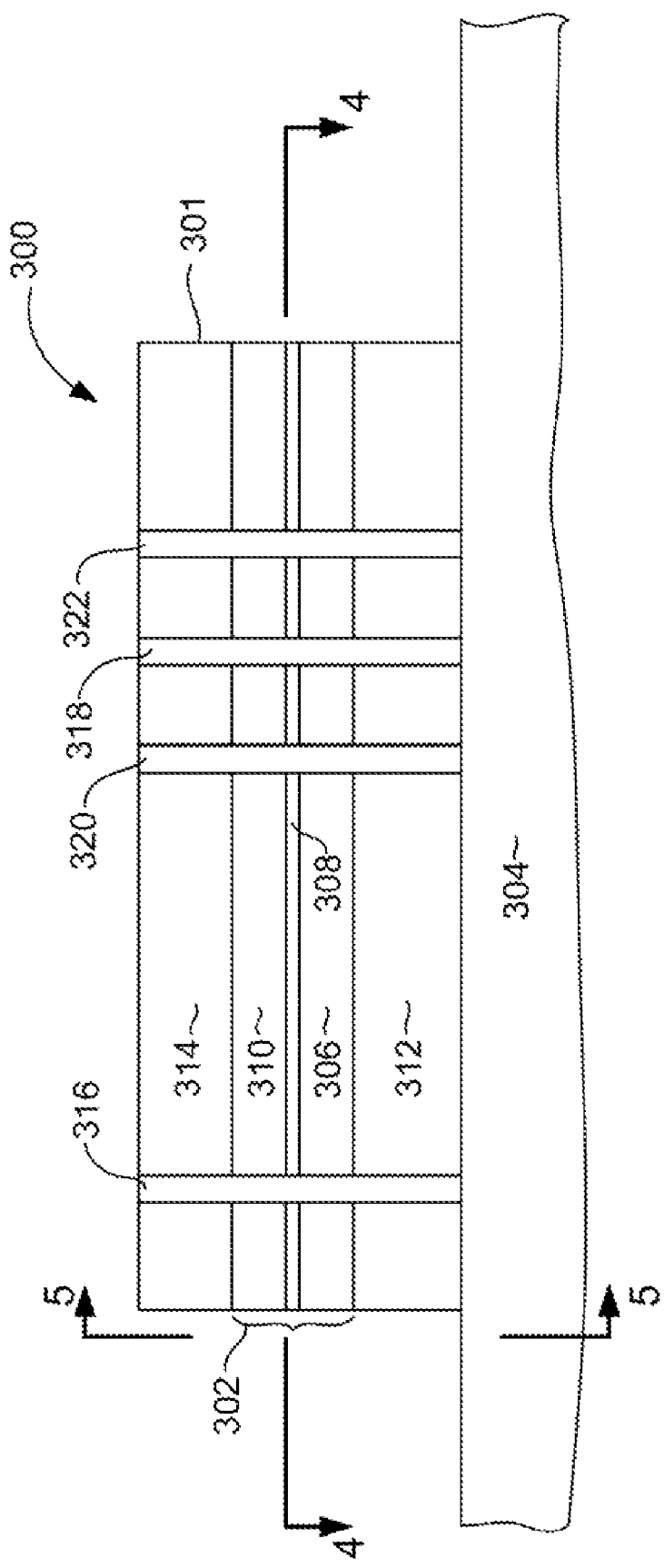
FIG. 3 is a schematic view of an EMR sensor and mesa structure as viewed from a side on which a plurality of leads is formed.
Figure 4:
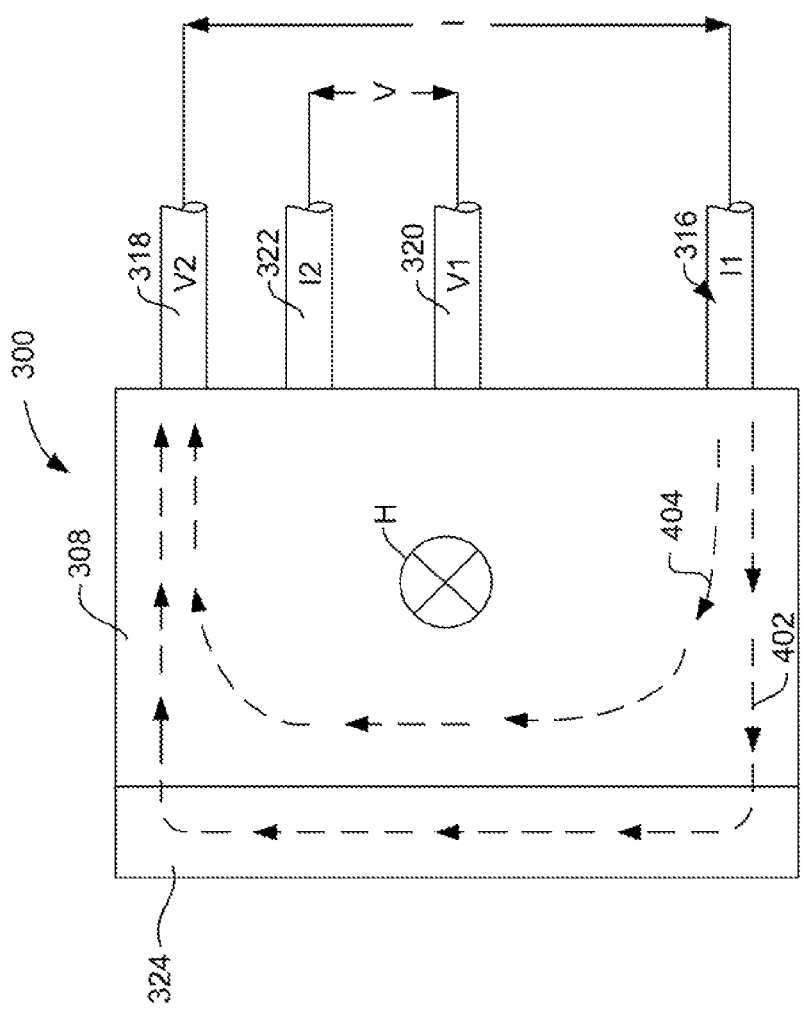
FIG. 4 is a cross sectional view taken from line 4-4 of FIG. 3.
Figure 5:
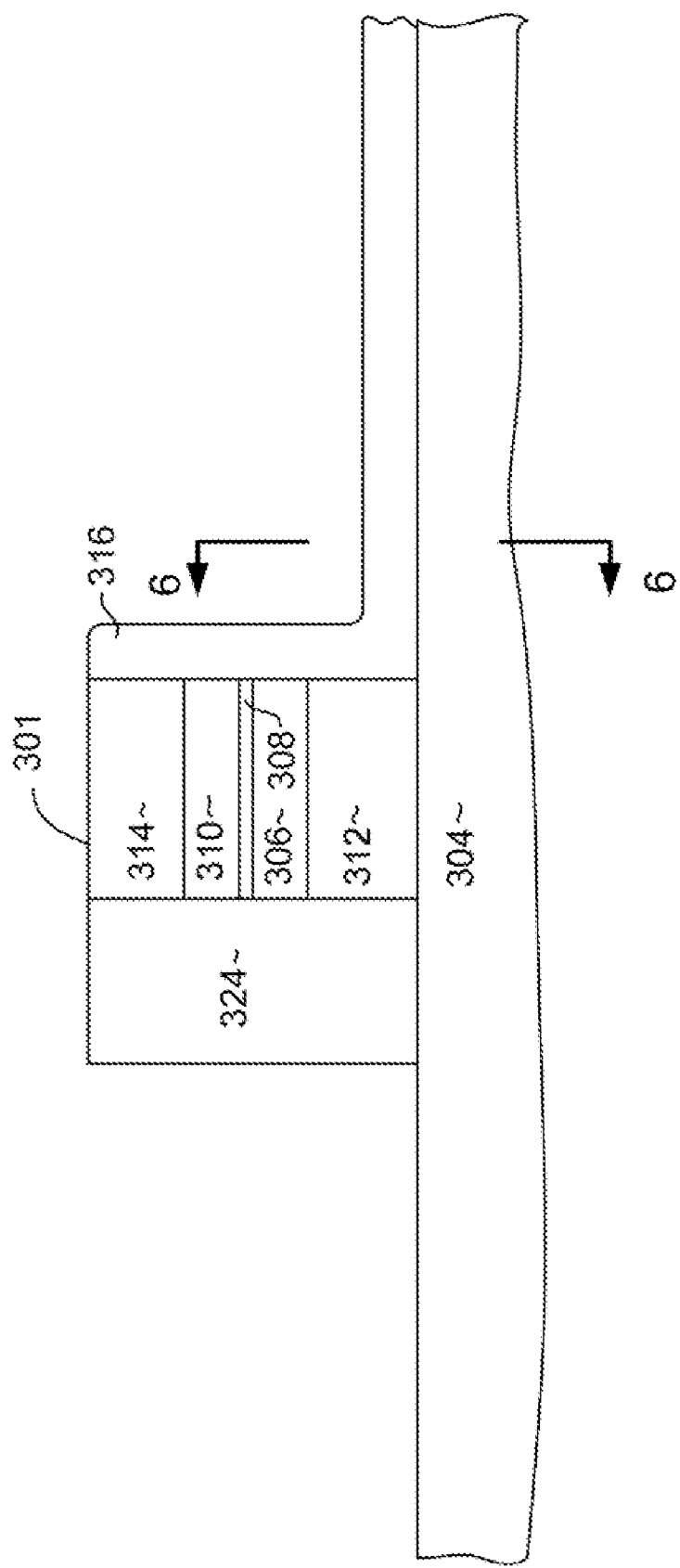
FIG. 5 is a view of a side of an EMR sensor as shown from the direction indicated by line 5-5 of FIG. 3.

With reference now to FIGS. 3, 4 and 5, an example of a Lorentz magnetoresistor, (in this case shown in the form of an extraordinary magnetoresistive sensor (EMR)) 300 for use in a magnetic head 121 (FIG. 2) is shown and described. Other Lorentz magnetoresistors may be substituted. A Lorentz magnetoresistive sensor (of which an EMR sensor is but one example) is a device that uses the Lorentz effect to detect the presence of a magnetic field and register this presence of a magnetic field as a change in electrical properties of the device. The Lorentz sensor 300 may be formed in a mesa structure 301 formed on a substrate 304 such as Si, GaAs, InAs, InSb or InP. The mesa structure 301 can include a hetero-structure 302. The heterostructure 302 can include a first layer 306 of semi-conducting material having a first band-gap, a second layer 308 of semi-conducting material formed on the first layer 306 and having a second bandgap that is smaller than that of the first layer 306, and a third semi-conducting layer 310 of semi-conducting material formed on top of the second layer 308 and having a third band gap that is greater than the second band gap. The materials in the first and third layers 306, 310 may be similar or identical. An energetic potential well (quantum well) is created by the first, second and third semi-conducting material layers due to the different band-gaps of the different materials. Thus, carriers can be confined inside layer 308, which is considered the EMR active film, or magnetically active film, in the sensor 300. This is also referred to as the quantum well or the two-dimensional electron gas (2DEG) layer.

The first layer 306 is typically formed on top of a buffer layer 312 that may be one or more layers. The buffer layer 312 can comprise several periods of a super-lattice structure that functions to prevent impurities present in the substrate from migrating into the functional layers 306, 308, 310. In addition, the buffer layer 312 is chosen to accommodate the typically different lattice constants of the substrate 304 and the functional layers of the heterostructure 302 to thus act as a strain relief layer between the substrate and the functional layers.

One or more doped layers are incorporated into the semiconductor material in the first layer 306, the third layer 310, or both layers 306 and 310, and are spaced apart from the boundary of the second and third semiconductor materials. The doped layers provide electrons (if n-doped) or holes (if p-doped) to the quantum well. The electrons or holes are concentrated in the quantum well in the form of a two dimensional electron-gas or hole-gas, respectively. N-doping layers are not necessary in the case of AlSb/InAs/AlSb wherein the electrons originate from deep donors in the AlSb layers as well as from states in the interface between the AlSb and the InAs quantum well. Higher electron densities can be obtained by the use of Te dopant atoms in the AlSb liner layers or their vicinity.

The layers 306, 308, 310 may be for example a $Al_{0.09}In_{0.91}Sb/InSb/Al_{0.09}In_{0.91}Sb$ heterostructure grown onto a semi-conducting Si substrate 304 with a buffer layer 312 in between. The layers 306, 308, 310 may also be AlSb/InAs/AlSb. Quantum wells are preferably made of narrow gap materials such as InSb, GaAs and InAs. Narrow band-gap semiconductors typically have a high electron mobility, since the effective electron mass is greatly reduced. For example, the room temperature electron mobility of InSb and InAs are 70,000 $cm^2/Vs$ and 35,000 $cm^2/Vs$, respectively.

The bottom $Al_{0.09}In_{0.91}Sb$ layer 306 formed on the buffer layer 312 has a thickness in the range of approximately 1-3 microns and the top $Al_{0.09}In_{0.91}Sb$ layer 310 can have a thickness in the range of approximately 10 to 1000 nm, typically 50 nm. The doping layers incorporated into layers 306, 310 have a thickness from one monolayer (delta-doped layer) up to 10 nm. The doping layer is spaced from the InSb/$Al_{0.09}In_{0.91}Sb$ boundaries of first and second or second and third semi-conducting materials by a distance of 10-300 Angstrom. An n type doping is preferred, since electrons typically have higher mobility than holes. The typical n-dopant is silicon with a concentration in the range of 1 to $10^{19}/cm^3$. In the case of AlSb/InAs/AlSb quantum wells, delta doping is also possible to increment the electron density in the InAs quantum well. This is typically done by intercalating a few monolayers of Te within the AlSb layers. The deposition process for the heterostructure 302 is preferably molecular-beam-epitaxy, but other epitaxial growth methods can be used.

A capping layer 314 is formed over the heterostructure 302 to protect the device from corrosion. The capping layer 314 is formed of an insulating material such as oxides or nitrides of aluminum or silicon (e.g., $Si_3N_4$, $Al_2O_3$) or a non-corrosive semi-insulating semiconductor. The layers 312, 306, 308, 310, 314 together form the mesa structure 301.

Two current leads 316, 318 and two voltage leads 320, 322 are patterned over one side of the EMR structure 302 so that they make electrical contact with the quantum well 308. A metallic shunt 324 is patterned on the side opposite the current and voltage leads 318-322 of the EMR structure 302 so that it also makes electrical contact with the quantum well 308. An applied magnetic field H (FIG. 4), i.e., the magnetic field to be sensed, is generally oriented normal to the plane of the layers in the EMR structure 302. The leads 316, 318, 320, 322 typically comprise metallic contacts, for example Au, AuGe, or Ge diffused into the device. For the case of an EMR device based on Si, the leads and shunt material are preferably a metallic alloy of Si, such as $TiSi_2$.

FIG. 4 is a top schematic view of the EMR sensor 300 through a section of the active film 308 and will illustrate the basic operation of the sensor. In the absence of an applied magnetic field H, sense current through the leads 316, 322 passes into the semiconductor active film 308 and is shunted through die shunt 324, as shown by line 402. When an applied magnetic field H, having a component perpendicular to the plane of the layers in the EMR structure 302, is present, as shown by the arrow tail into the paper in FIG. 2, current is deflected from the shunt 324 and passes primarily through the semiconductor active film 308, as shown by line 404. The change in electrical resistance due to the applied magnetic field is detected across the voltage leads 320, 318.

Although, the EMR sensor 300 has been described in terms of a mesa structure 301 having a semiconductor heterostrucure 302 that forms a quantum well, this is by way of example only. Various other structures are possible for forming an EMR sensor. For example, the mesa structure could be formed as a block of semiconducting material Si, without the multi-layer structure 302. Other suitable semiconductor materials are thin films of the III-V group such as GaAs and InAs. Although such thin films have no quantum well structures, in the case of Si, it has been found to provide effective EMR sensing capabilities. Therefore, the EMR sensor described above is for purposes of illustration only, and the integrated amplification of the present invention (to be described below) can be used with any form of Lorentz magnetoresistive sensor. In addition, although the integrated signal amplification is being described herein in terms of use with an EMR sensor, the integrated signal amplification could be used in another type of sensor, such as a giant magnetoresistive sensor (GMR) or tunnel junction sensor (TMR).

Figure 8:
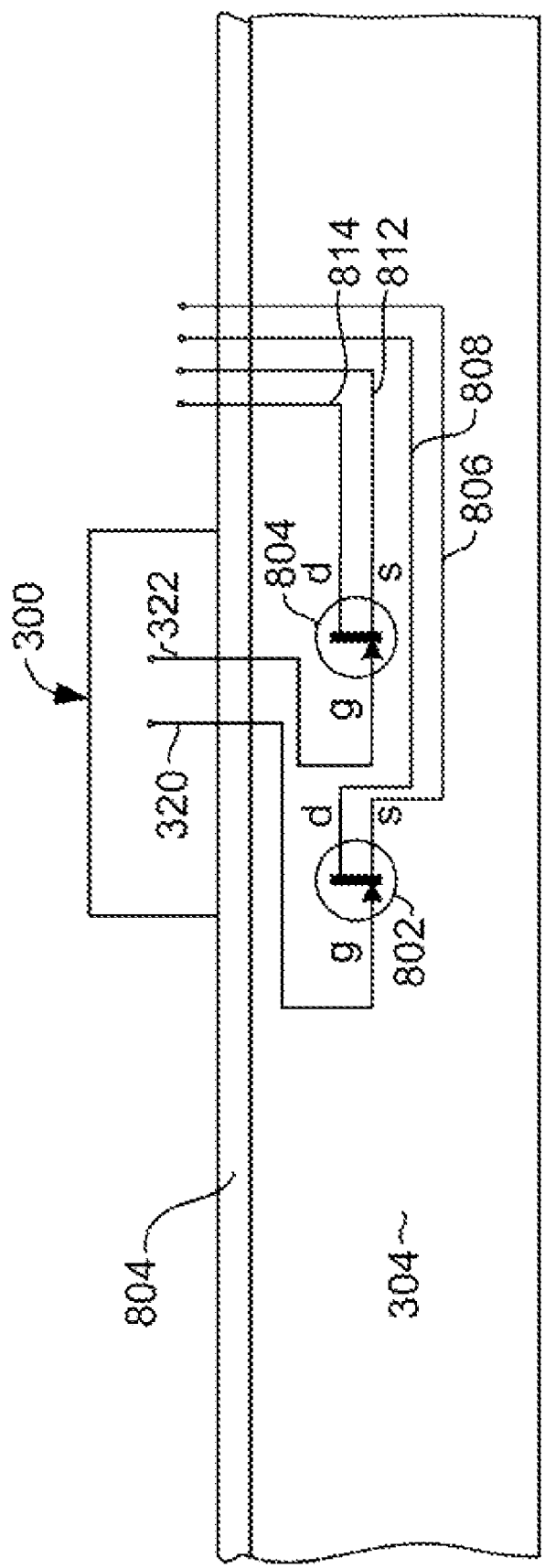
FIG. 8 is a schematic view of an EMR sensor and an integrated amplification circuit.

FIG. 8, shows a schematic illustration of an integrated amplification structure that can efficiently amplify a signal from the EMR sensor 300. The proximity of the amplifier to the signal source drastically reduces the added noise concomitant with remote signal amplification. Although prior art EMR sensors have used the substrate 304 merely as a support structure onto which to build and hold the mesa 301, the present invention takes advantage of the fact that the substrate is constructed of a semiconductor material and incorporates a signal amplifying transistor within the substrate structure 304. With particular reference to FIG. 8, one of the voltage leads 320 is connected with the gate of an integrated amplifier formed in the substrate of 304. The amplifier circuit 802 can be constructed, for example, as a MOSFET transistor amplifier, or some other type of semiconductor based amplifier structure employing other transistor types such as CMOS, Bi-Polar, etc. An insulation layer 804 such as an oxide layer may be formed between the substrate 304 and the EMR sensor 300.

Although, the integrated amplification can be accomplished with only a single amplifier 802 such as that described above, a second amplifier 810 can be provided, with the gate of the second amplifier 810 being connected with the other voltage lead 322 of the EMR or other Lorentz magnetorsistor sensor.

As can be seen with reference to FIG. 8, each of the amplifier circuits 802, 810 can have a source lead 806, 812 and a drain lead 808, 814. These leads can be connected (such as through a via formed in the oxide layer 804) with ancillary electronics (not shown) and then to other amplification and processing circuitry such as the data recording channel circuitry 125 discussed above with reference to FIG. 1. Of course, the EMR sensor 300 and integrated amplifier 802 and/or 810 could be used in applications other than data recording, in which case the source and drain circuitry 806, 808 would be connected with other circuitry appropriate to that application. For example, the current leads from the EMR device 300 could be connected directly to the built-in amplifier if the EMR devices is operated in constant voltage mode, thereby providing an alternative sensing mode to the conventional voltage detection mode.

Figure 6:
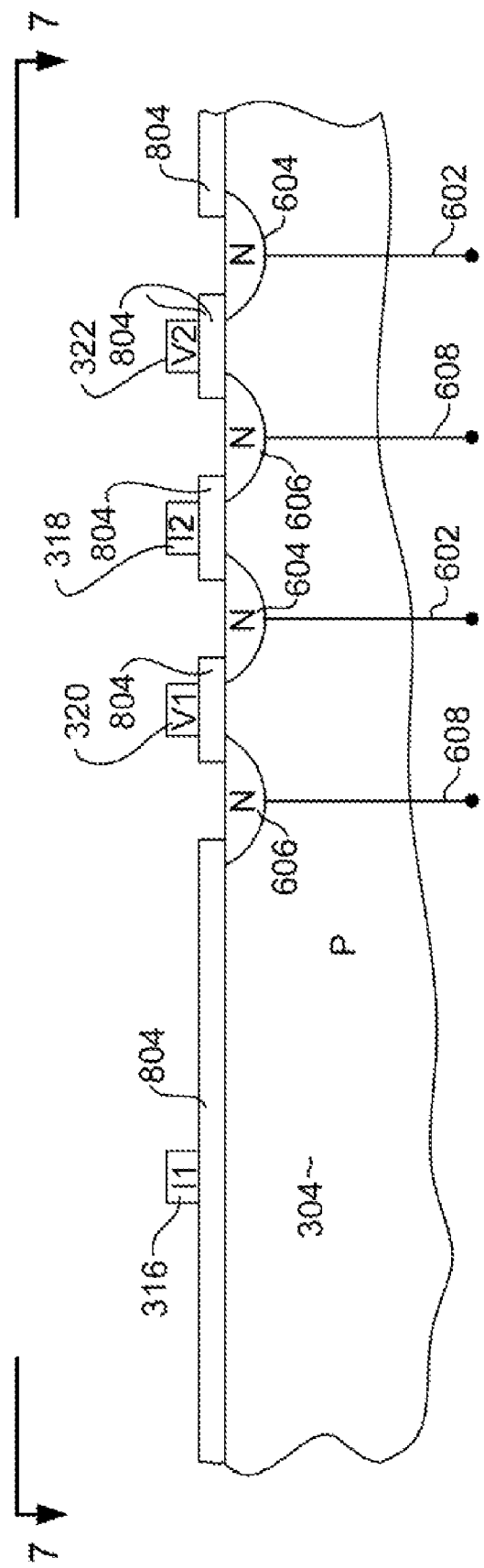
FIG. 6 is a cross sectional view of a lead and integrated amplifier structure as shown taken from line 6-6 of FIG. 5.
Figure 7:
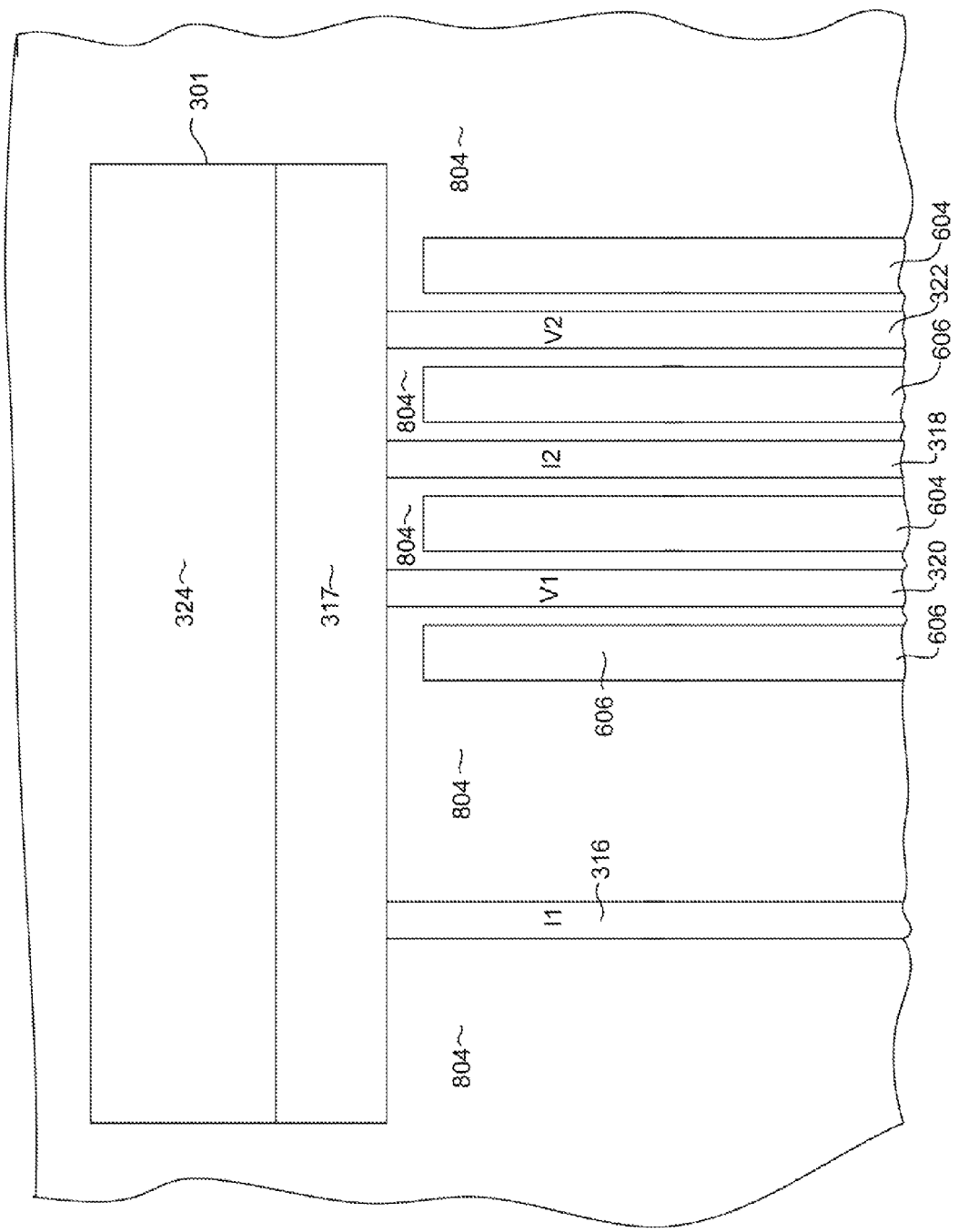
FIG. 7 is a top down view of the lead and integrated amplifier structure as viewed from the direction indicated by line 7-7 of FIG. 6.

With reference now to FIGS. 6 and 7, a possible structure for constructing an EMR sensor 300 with integrated amplification 802 is described. FIG. 6 shows a cross sectional view of the substrate, with the oxide layer 804 formed thereover. FIG. 7 shows a top down view of the structure shown in FIG. 6. The current leads 316, 318 and voltage leads 320, 322 can be formed over the oxide layer 804. As shown in FIG. 7, the leads 316-322 are connected with the mesa structure of the EMR sensor 300 as described with reference to FIGS. 3-5 or other structure that undergoes a magnetoresistive change in the presence of an external magnetic field.

With reference to FIG. 6, the substrate 304 is constructed of a semiconductor material, such as Si, GaAs, InAs or InSb. One or more transistors, such as a MOSFET, CMOS or some other type of transistor amplifier can be formed in the substrate and appropriately connected with a voltage or a current lead of the EMR device 300. For example, to construct an integrated MOSFET transistor amplifier, the substrate can be a p-type material such as Si, and portions of the substrate can be implanted with phosphorous through a mask to produce N-doped regions 604, 606.

In the case shown in FIG. 6, the voltage lead V2 322 (or voltage lead V1 320) provide a gate voltage. The N doped region 604, can be connected with an electrical lead 602 for example to provide a source current at the N doped region 604. A lead 608 can be connected with the other N doped region 606 to provide a drain from which a signal can be read. Of course, the above description of a specific transistor circuit incorporated into a substrate onto which an EMR device is constructed of is for purposes of illustration only. Many other types and constructions of transistors can be incorporated into a substrate, and would all fall within the intended scope of the invention.

This built-in signal amplification is needed to extend the usefulness of EMR devices to detect bit dimensions in the nano-scale regime as it will be required for Tb/in$^2$ recording. The basic upper structure of the EMR sensor can be any type of EMR sensor device. This invention uses the fact that the substrate material can be used as an active electronic material to provide built-in amplification, rather than merely as a physical support structure providing no electronic functionality as has been the case in the prior art. In such prior art devices, because the signal from the EMR device itself is small, the signals have needed to be remotely amplified leading to noise problems and rise-time limitations. The integrated amplification of the present invention avoids these problems by providing signal amplification right at the location of the EMR device. In the present invention, amplifiers such as CMOS transistors are used to amplify the voltage signal, using the voltage region of the EMR device as a gate voltage. This could be used with just one voltage sense, or with compared voltage sense for greater sensitivity. This also gives a low-impedance output, leading to faster device operation.

It should also be pointed out that, while the integrated signal amplification has been described above as being useful with an EMR sensor, such integrated signal amplification could be used with many other types of magnetic sensor devices. For example, the EMR sensor could be replaced with another type of magnetoresistive sensor, such as but not limited to: a current in plane or current perpendicular to plane giant magnetoresistive sensor (CPP OR CIP-GMR); tunnel magnetoresistive sensor (TMR) also known as a magnetic tunnel junction sensor (MTJ); Coulomb blockade anisotropic magnetoresistive device; Hall effect sensor; spin accumulation device; or spin Hall effect sensor. The integrated signal amplification could also be used to amplify a signal of some other sensor devices other than a magnetoresistive sensor.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A Lorentz magnetoresistive sensor, comprising:
   a substrate;
   an amplifier formed within the substrate; and
   a Lorentz magnetoresistive sensor formed on the substrate and electrically connected with the amplifier;
   wherein the Lorentz magnetoresistive sensor comprises a plurality of materials forming a quantum well structure and an electrically conductive shunt connected with the quantum well structure.

2. A Lorentz magnetoresistive sensor, comprising:
   a substrate;
   an amplifier formed within the substrate; and
   a Lorentz magnetoresistive sensor formed on the substrate and electrically connected with the amplifier;
   wherein the sensor comprises first second and third layers of semiconductor materials each having a band gap, the second layer being formed between the first and third layers and having a band gap that is less than the band gap of the first and third layers.

3. A Lorentz magnetoresistive sensor, comprising:
   a substrate;
   an amplifier formed within the substrate; and
   a Lorentz magnetoresistive sensor formed on the substrate and electrically connected with the amplifier;
   wherein the sensor further comprises a magnetically active region comprising a layer of semiconductor material and an electrically conducting shunt structure electrically connected with the magnetically active region.

4. A Lorentz magnetoresistive sensor, comprising:
   a substrate;
   an amplifier formed within the substrate; and
   a Lorentz magnetoresistive sensor formed on the substrate and electrically connected with the amplifier;
   wherein the sensor further comprises a magnetically active region comprising a layer of silicon and an electrically conducting shunt structure electrically connected with the magnetically active region.

5. A Lorentz magnetoresistive sensor, comprising:
   a substrate;
   an amplifier formed within the substrate; and
   a Lorentz magnetoresistive sensor formed on the substrate and electrically connected with the amplifier;

wherein the substrate comprises a semiconductor, and further comprising an oxide layer formed between the EMR sensor and the semiconductor of the substrate.

6. A Lorentz magnetoresistive sensor, comprising:
a substrate;
an amplifier formed within the substrate; and
a Lorentz magnetoresistive sensor formed on the substrate and electrically connected with the amplifier;
wherein the substrate comprises Si, and further comprising an oxide layer formed between the EMR sensor and the substrate.

7. A Lorentz magnetoresistive sensor, comprising:
a substrate;
an amplifier formed within the substrate; and
a Lorentz magnetoresistive sensor formed on the substrate and electrically connected with the amplifier;
wherein the amplifier has a gate, the sensor further comprising, a voltage lead connected with the EMR sensor and connected with a gate of the amplifier.

8. A magnetoresistive sensor, comprising:
a substrate comprising a semiconductor material;
a magnetically active structure formed on the substrate;
an electrically conductive shunt structure connected with the magnetically active structure;
first and second voltage leads connected with the magnetically active structure;
a first amplifier integrated into the substrate and having a gate connected with the first voltage lead; and
a second amplifier integrated into the substrate and having a gate connected with the second voltage lead.

9. A magnetoresistive sensor as in claim 8 wherein the magnetically active structure includes a semiconductor heterostructure that forms a quantum well.

10. A magnetoresistive sensor as in claim 8 wherein the magnetically active structure includes a layer of semiconductor material.

11. A magnetoresistive sensor as in claim 8 further wherein the substrate further comprises a layer of oxide formed between the semiconductor material of the substrate and the magnetically active structure and shunt structure.

* * * * *